(12) United States Patent
Howard et al.

(10) Patent No.: US 6,580,886 B1
(45) Date of Patent: Jun. 17, 2003

(54) MODULE TO MODULE ATTACHING AND SECURING APPARATUS

(75) Inventors: John L. Howard, Rochester, NY (US); John J. Bigenwald, Penfield, NY (US); Bruce E. Crayton, Rochester, NY (US)

(73) Assignee: Xerox Corporation, Stamford, CT (US)

( * ) Notice: Subject to any disclaimer, the term of this patent is extended or adjusted under 35 U.S.C. 154(b) by 3 days.

(21) Appl. No.: 10/058,718

(22) Filed: Jan. 30, 2002

(51) Int. Cl.[7] ............................................... C03G 15/00
(52) U.S. Cl. ....................................................... 399/110
(58) Field of Search ................................. 399/110, 113, 399/114, 107

(56) References Cited

U.S. PATENT DOCUMENTS 5,241,344 A * 8/1993 Takano ........................ 399/115

FOREIGN PATENT DOCUMENTS

| JP | 11-65195 | * | 3/1999 |
| JP | 2000-257614 | * | 9/2000 |
| JP | 2001-51463 | * | 2/2001 |

* cited by examiner

Primary Examiner—Quana M. Grainger
(74) Attorney, Agent, or Firm—Tallam I. Nguti

(57) ABSTRACT

An attaching and securing apparatus for removably attaching a first module of an office machine to a second module thereof. The attaching and securing apparatus includes (a) a first lug member on the first module having a first set of aligning features and a first screw receiving hole; (b) a second lug member on the second module having a second screw receiving hole for aligning with the first screw receiving hole, and a second set of aligning features for aligning with the first set of aligning features; (c) a ratchet device located inside at least one of the first and the second screw receiving holes for receiving and retaining a screw inserted therethrough, the ratchet device including at least one biased and deflectable spring member having a first normal position for reducing a diameter of the at least one screw receiving hole, and a second deflected position for engaging threads of an inserted screw and for effectively retaining the inserted screw within the first and the second screw receiving holes; and (d) a removable screw for manually and easily inserting through the first and the second screw receiving holes, the screw having a root diameter, surface features, and an outside diameter essentially equal to the diameter of each of the first and the second screw receiving holes, thereby enabling easy manual securing and removable attachment of the first module of the office machine to the second module thereof.

20 Claims, 5 Drawing Sheets

MODULE TO MODULE ATTACHING AND SECURING APPARATUS

BACKGROUND OF THE INVENTION

The present invention relates generally to office machines, and particularly to a removable, low cost and effective user installable module to module attaching and securing apparatus for safely and effectively attaching and securing one machine module to another without tools.

Office machines include copiers, printers, fax machines, and the like. When delivered to an office after purchase, it is common for some such machines to require securing to a base, or for those of them that come as modules, for one module to be stacked on, and secured to, another module. This is becoming more of the case with some electrostatographic reproduction machines. As such, it is more economical to have a securing system that can be installed by the purchaser or user rather than by a technical service operator provided by the vendor.

Generally, the process of electrostatographic reproduction, as practiced in electrostatographic reproduction machines, includes charging a photoconductive member to a substantially uniform potential so as to sensitize the surface thereof. A charged portion of the photoconductive surface is exposed at an exposure station to a light image of an original document to be reproduced. Typically, an original document to be reproduced is placed in registration, either manually or by means of an automatic document handler, on a platen for such exposure.

Exposing an image of an original document as such at the exposure station, records an electrostatic latent image of the original image onto the photoconductive member. The recorded latent image is subsequently developed using a development apparatus by bringing a charged dry or liquid developer material into contact with the latent image. Two component and single component developer materials are commonly used. A typical two-component dry developer material has magnetic carrier granules with fusible toner particles adhering triobelectrically thereto. A single component dry developer material typically comprising toner particles only can also be used. The toner image formed by such development is subsequently transferred at a transfer station onto a copy sheet fed to such transfer station, and on which the toner particles image is then heated and permanently fused so as to form a "hardcopy" of the original image.

As pointed out above, it is common for some such machines to require securing to a base, or for those of them that come as modules, for one module to be stacked on, and secured to, another module. As such, it is more economical to have a securing system that can be installed by the purchaser or user rather than by a technical service operator provided by the vendor.

Conventionally, such copiers and printers are more commonly attached and secured to a stand using several long unique, and often expensive screws which may require tools. The installation of these screws is generally awkward due to lack of easy access to installation holes which require detailed "worded" instructions to enable a successful install. If it is difficult, the customer may not complete the install and securing task, undesirably risking damage and injury.

There is therefore a need for an attaching and securing apparatus that enables the customer's ability to easily complete and successfully secure the product to the stand without tools and without worded instructions.

SUMMARY OF THE INVENTION

In accordance with the present invention, there is provided an attaching and securing apparatus for removably attaching a first module of an office machine to a second module thereof. The attaching and securing apparatus includes (a) a first lug member on the first module having a first set of aligning features and a first screw receiving hole; (b) a second lug member on the second module having a second screw receiving hole for aligning with the first screw receiving hole, and a second set of aligning features for aligning with the first set of aligning features; (c) a ratchet device located inside at least one of the first and the second screw receiving holes for receiving and retaining a screw inserted therethrough, the ratchet device including at least one biased and deflectable spring member having a first normal position for reducing a diameter of the at least one screw receiving hole, and a second deflected position for engaging threads of an inserted screw and for effectively retaining the inserted screw within the first and the second screw receiving holes; and (d) a removable screw for manually and easily inserting through the first and the second screw receiving holes, the screw having a root diameter, surface features, and an outside diameter essentially equal to the diameter of each of the first and the second screw receiving holes, thereby enabling easy manual securing and removable attachment of the first module of the office machine to the second module thereof.

BRIEF DESCRIPTION OF THE DRAWINGS

In the detailed description of the invention presented below, reference is made to the drawings in which.

DETAILED DESCRIPTION OF THE INVENTION

While the present invention will be described in connection with a preferred embodiment thereof, it will be understood that it is not intended to limit the invention to that embodiment. On the contrary, it is intended to cover all alternatives, modifications, and equivalents as may be included within the spirit and scope of the invention as defined by the appended claims.

Figure 7:
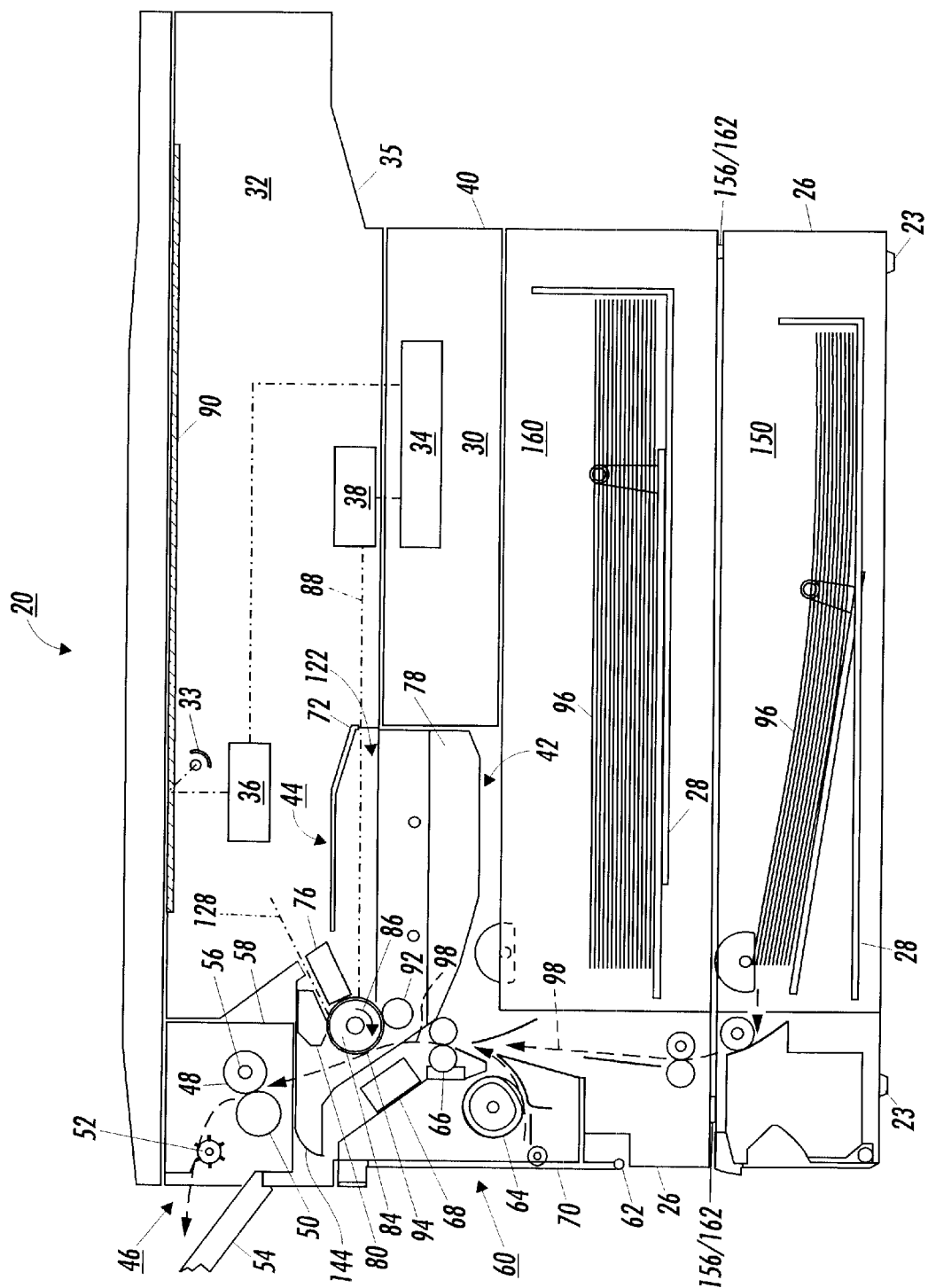
FIG. 7 is a front vertical illustration of an exemplary office machine in the form of a compact electrostatographic reproduction machine comprising separate mutually aligning modules attached and secured in accordance with the present invention.

Referring first to FIG. 7, there is illustrated a frameless exemplary compact electrostatographic reproduction machine 20 comprising separately framed mutually aligning modules according to the present invention. The compact machine 20 is frameless, meaning that it does not have a separate machine frame to which electrostatographic process subsystems are assembled, aligned to the frame, and then aligned relative to one another as is typically the case in conventional machines. Instead, the architecture of the compact machine 20 is comprised of a number of individually framed, and mutually aligning machine modules that variously include pre-aligned electrostatographic active process subsystems.

As shown, the frameless machine 20 comprises at least a framed copy sheet input module (CIM) 160. Preferably, the machine 20 comprises a pair of copy sheet input modules, a main or primary module the CIM 160, and an auxiliary module the (ACIM) 150, each of which has a set of lugs 156, 162 that are part of the module to module attaching and securing apparatus of the present invention (to be described in detail below), for attaching and securing the ACIM to the CIM. The ACIM 150 includes a set of legs 23 for supporting the machine 20 on a surface, for example on the floor. As also shown, each copy sheet input module (CIM, ACIM) includes a module frame 26 and a copy sheet stacking and lifting cassette tray assembly 28 that is slidably movable in and out relative to the module frame 26. When as preferred here, the machine 20 includes two copy sheet input modules, the very base module is considered the auxiliary module (the ACIM), and the top module which mounts and mutually aligns against the base module is considered the primary module (the CIM).

The machine 20 next comprises a framed electronic control and power supply (ECS/PS) module 30, that as shown mounts onto, and is mutually aligned against the CIM 160 (which preferably is the top or only copy sheet input module). A framed latent image forming imager module 32 then mounts over and is mutually aligned against the ECS/PS module. The ECS/PS module 30 includes all controls and power supplies (not shown) for all the modules and processes of the machine 20. It also includes an image processing pipeline unit (IPP) 34 for managing and processing raw digitized images from a Raster Input Scanner (RIS) 36, and generating processed digitized images for a Raster Output Scanner (ROS) 38. As shown, the RIS 36, the ROS 38, and a light source 33, framed separately in an imager module frame 35, comprise the imager module 32. The ECS/PS module 30 also includes harnessless interconnect boards and inter-module connectors (not shown), that provide all power and logic paths to the rest of the machine modules. An interconnect board (PWB) (not shown) connects the ECS controller and power supply boards (not shown) to the inter-module connectors., as well as locates all of the connectors to the other modules in such a manner that their mating connectors would automatically plug into the ECS/PS module during the final assembly of the machine 20. Importantly, the ECS/PS module 30 includes a module frame 40 to which the active components of the module as above are mounted, and which forms a covered portion of the machine 20, as well as locates, mutually aligns, and mounts to adjacent framed modules, such as the CIM 160 and the imager module 32.

The framed copy sheet input modules 150, 160, the ECS/PS module 30, and the imager module 32, as mounted above, define a cavity 42. The machine 20 importantly includes a customer replaceable, all-in-one CRU or process cartridge module 44 that is insertably and removably mounted within the cavity 42, and in which it is mutually aligned with, and operatively connected to, the framed CIM, ECS/PS and imager modules 160, 30, 32.

As further shown, the machine 20 includes a framed fuser module 46, that is mounted above the process cartridge module 44, as well as adjacent an end of the imager module 32. The fuser module 46 comprises a pair of fuser rolls 48, 50, and at least an exit roll 52 for moving an image carrying sheet through, and out of, the fuser module 46 into an output or exit tray 54. The fuser module also includes a heater lamp 56, temperature sensing means (not shown), paper path handling baffles(not shown), and a module frame 58 to which the active components of the module, as above, are mounted, and which forms a covered portion of the machine 20, as well as locates, mutually aligns, and mounts to adjacent framed modules, such as the imager module 32 and the process cartridge module 44.

The machine then includes an active component framed door module 60 that is mounted pivotably at pivot point 62 to an end of the CIM 160. The door module 60 as mounted, is pivotable from a substantially closed vertical position into an open near-horizontal position in order to provide access to the process cartridge module 44, as well as for jam clearance of jammed sheets being fed from the CIM 160. The Door module 60 comprises active components including a bypass feeder assembly 64, sheet registration rolls 66, toner image transfer and detack devices 68, and the fused image output or exit tray 54. The door module 60 also includes drive coupling components and electrical connectors (not shown), and importantly, a module frame 70 to which the active components of the module as above are mounted, and which forms a covered portion of the machine 20, as well as, locates, mutually aligns, and mounts to adjacent framed modules, such as the CIM 160, the process cartridge module 44, and the fuser module 46.

More specifically, the machine 20 can be a desktop digital copier, and each of the modules 160, 150, 30, 32, 44, 48, 60, is a high level assembly comprising a self-containing frame including active electrostatographic process components specified for sourcing, and enabled as a complete and shippable product. A unique advantage of the machine 20 as such is that its self-standing, specable, testable, and shippable module units specifically allow for high level sourcing to a small set of module-specific skilled production suppliers. Such high level sourcing greatly optimizes the quality, the total cost, and the time of delivering of the final product, the machine 20. In accordance with the present invention, the whole machine 20 can be attached and secured to a base (FIG. 6) and/or one module thereof can be attached and secured to another module using the module to module attaching and securing apparatus 152, 154 of the present invention (to be described in detail below).

Figure 1:
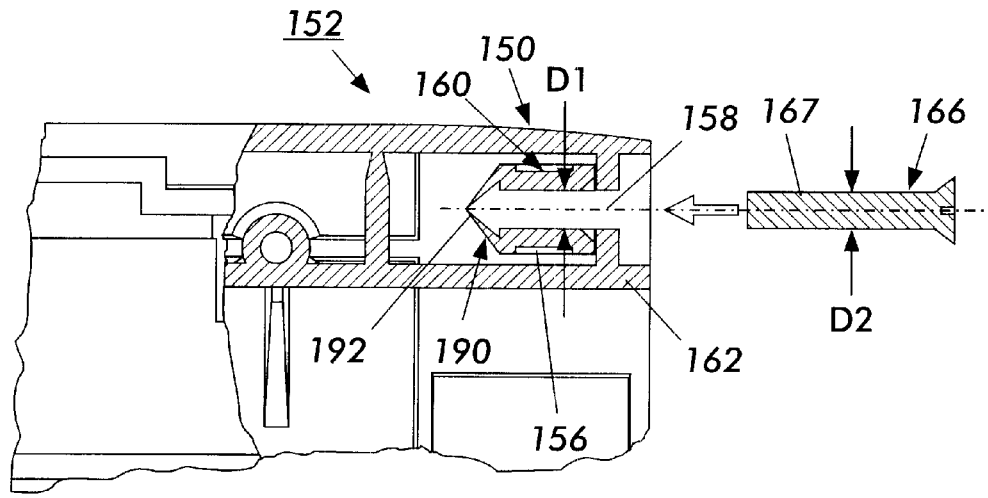
FIG. 1 is a schematic illustration of a first embodiment of the module to module attaching and securing apparatus of the present invention with the screw thereof about to be inserted.
Figure 2:
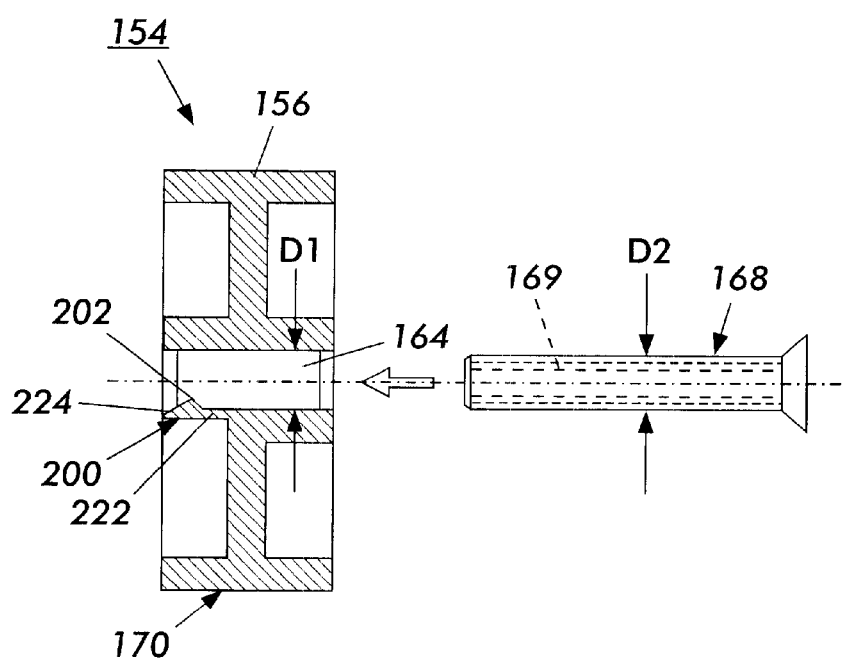
FIG. 2 is a schematic illustration of a second embodiment of the module to module attaching and securing apparatus of the present invention with the screw thereof about to be inserted.
Figure 3:
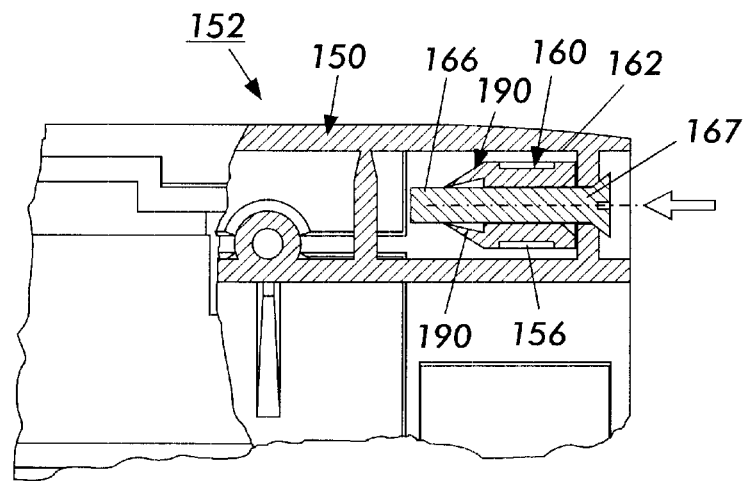
FIG. 3 is a schematic illustration of the first embodiment of the module to module attaching and securing apparatus of FIG. 1 with the screw thereof fully inserted.
Figure 4:
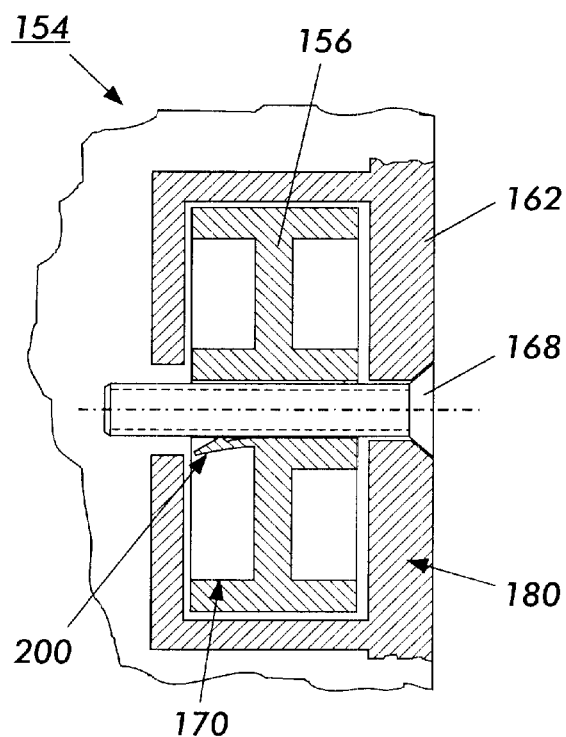
FIG. 4 is a schematic illustration of a second embodiment of the module to module attaching and securing apparatus of FIG. 2 with the screw thereof fully inserted.

Referring now to FIGS. 1–7, the module to module attaching and securing apparatus 152, 154 of the present invention is further illustrated in detail. A first embodiment 152 of the securing apparatus of the present invention is shown in FIGS. 1 and 3, and a second embodiment 154 is shown in FIGS. 2 and 4.

As illustrated, the first and second embodiments 152, 154 each include a first lug member 156 on the first module 150, 170 having a first set of aligning features 156 (the lug members also serve as aligning or locating members), and a first screw receiving hole 158. The embodiments also each include a second lug member 162 on the second module 160, 180 having a second screw receiving hole 164 for aligning with the first screw receiving hole 158, and a second set of aligning features 162 (the lug members also serve as aligning or locating members), for aligning with the first set of aligning features 156. The first and second embodiments 152, 154 also each include a ratchet device 190, 200 located inside at least one of the first and the second screw receiving holes 158, 164 for receiving and retaining a screw 166, 168 inserted therethrough.

The ratchet device 190, 200 includes at least one biased and deflectable spring member 210, 220 having a first normal position (FIGS. 1 and 3) for reducing a diameter D1 of the at least one screw receiving hole 158, 164 to d1 that is substantially less than the outside diameter D2 of an inserted screw 166, 168. They (190, 200) each also have a second deflected position (FIGS. 2 and 4) for engaging surface features 167, 169, (threads 167, and slots 169) of the inserted screw 166, 168 and for effectively retaining the inserted screw within the first and the second screw receiving holes 158, 164. As shown, the removable screw 166, 168 for manually and easily inserting through the first and the second screw receiving holes has an outside diameter D2 essentially equal to the diameter D1 of each of the first and the second screw receiving holes. The surface features 167, 169 (threads 167 or slots 169) that are engageable by the ratchet device, thereby enabling easy manual securing and removable attachment of the first module of the office machine to the second module thereof.

As shown in FIGS. 1–4, the at least one biased and deflectable spring member 110, 120 in each case has at least one sharp distal edge 192, 202 for effectively engaging the surface features 167, 169 on a surface of the inserted screw 166, 168. The surface features 167, 169 of the removable screw 166, 168 comprise (as in the first embodiment 152) screw threads 167 rising above the root diameter surface D3 of the screw 166. In the second embodiment 154, the root diameter surface also defines the outside diameter D2, and the surface features of the removable screw comprise slots 169 cut into the root diameter surface as such. In order to maintain an aesthetic outside appearance to the attached modules, the screw receiving holes 158, 164 are each countersunk from the outside of the lug members 156, 162.

In operation, the customer or user installs the screw 166, 168 in the clearance of the screw receiving holes or openings 158, 164 simply by using a finger or thumb to push the unique screw through the holes. When the modules 150, 170 and 160, 180 are located by the lug members 156, 162, the first and second screw holes 158, 164 are also aligned, thus making such manual insertion relatively easy. This thus eliminates the need for a tool. During such installation of the screw 166, 168, the screw threads 167 or the outside diameter D2 of the screw act to deflect a plastic feature or ratchet device 190, 200, each having the sharp edge 192, 202 within the hole 158, 164 in the locator peg or lug member 156, 162 of the stand or first module 150, 170. The plastic feature or ratchet device 190, 200 thus serves to receive and retain the screw 166, 168 and so prevents it from backing out of the holes 158, 164 unexpectedly.

Figure 5:
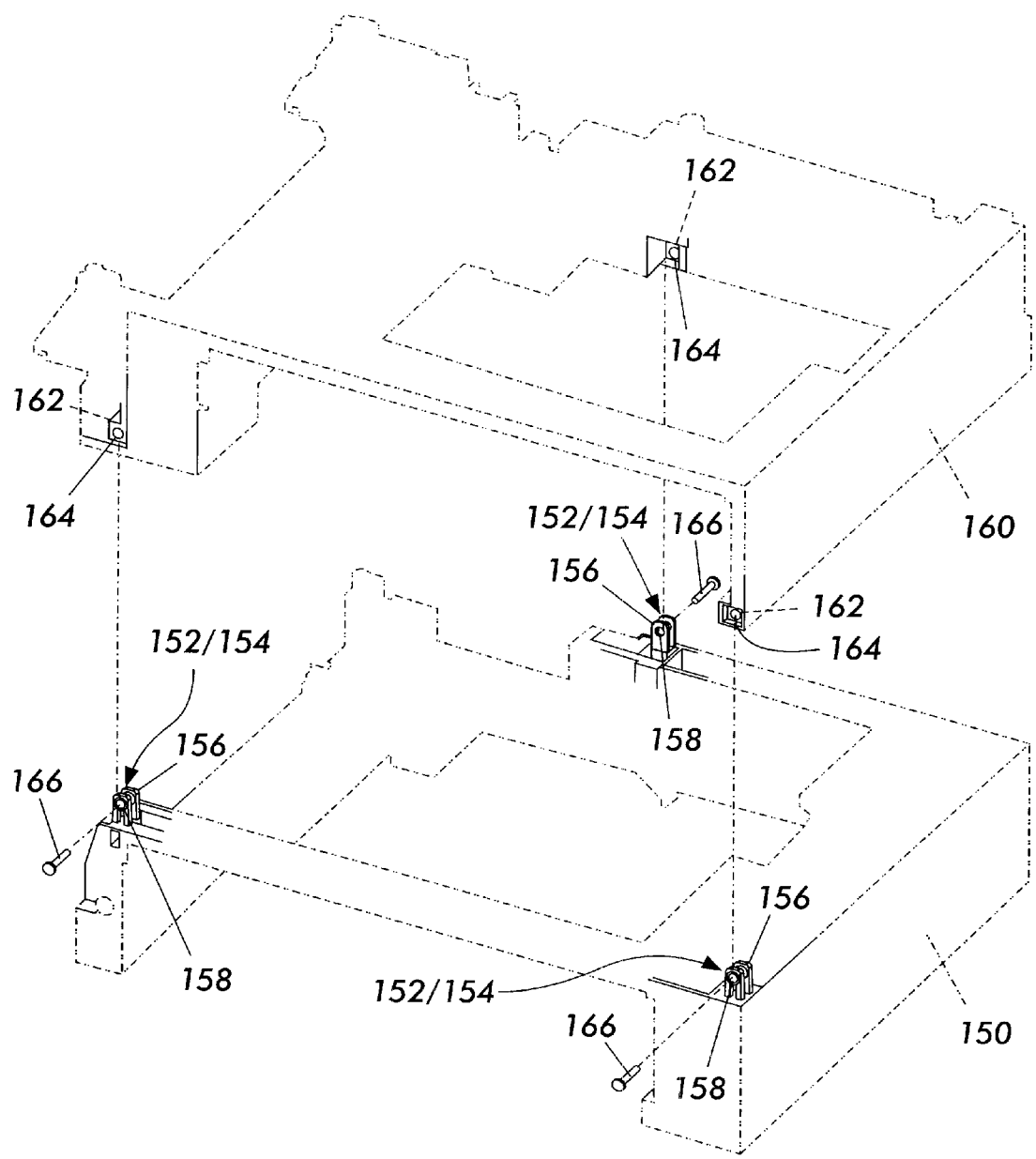
FIG. 5 is an illustration of a first scheme for attaching and securing a first module of an office machine to a second module thereof.
Figure 6:
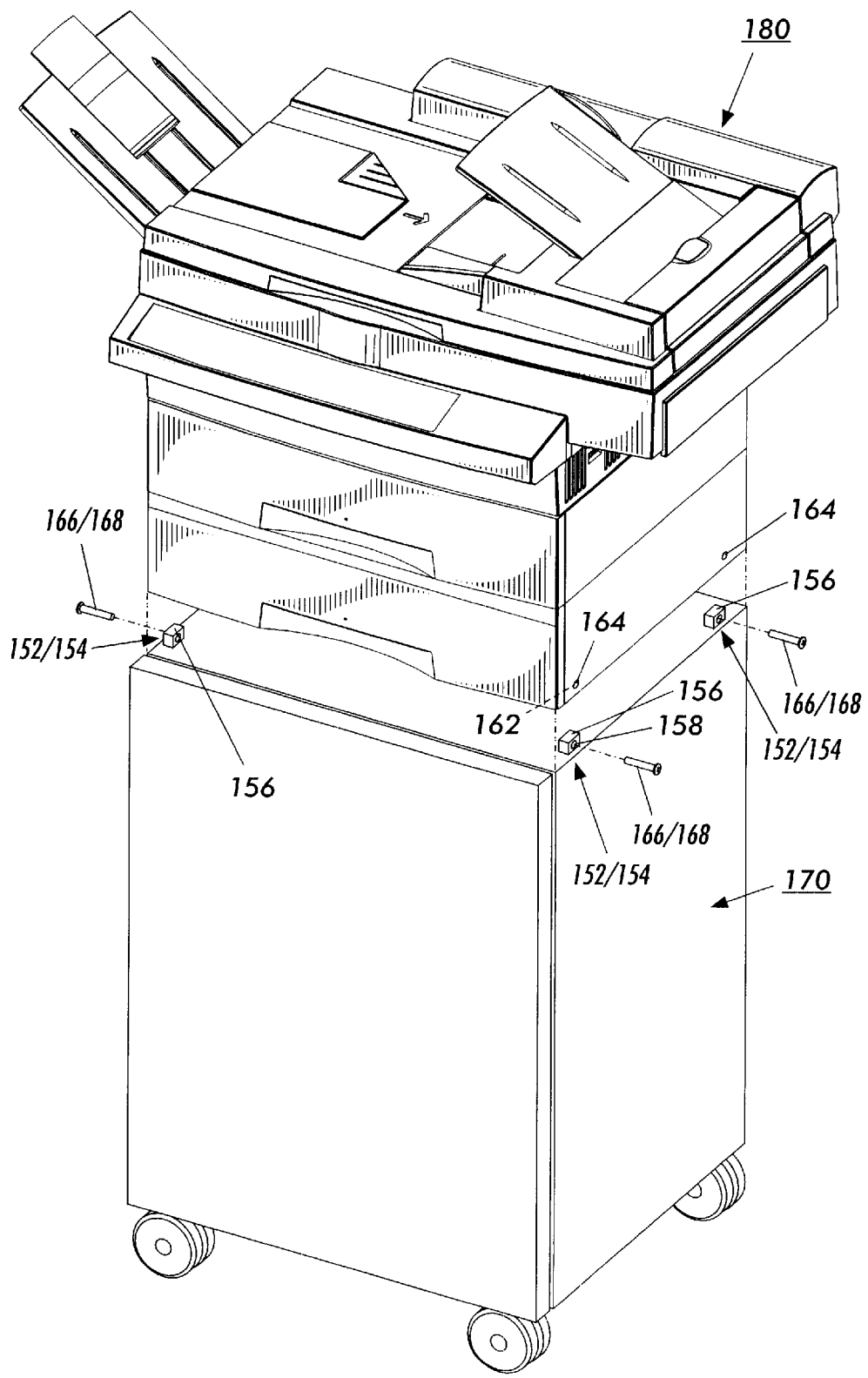
FIG. 6 is an illustration of a second scheme for attaching and securing an office machine to a base therefor.

In one scheme as illustrated in FIG. 6, four such securing and attaching apparatus 152, 154 include at least three sets of module-to-module locating or lug members 156, 162. As shown in FIG. 5, three sets are used for attaching and securing an auxiliary paper supply tray 150 to another module 160, with two sets mounted at the corners in the front and one mounted to the center in the rear of the modules. In FIG. 6 four sets are used for attaching and securing an image output terminal portion 180 of a copier/printer to a stand module 170, with one set being mounted at each of the four corners of a top of the machine stand 170. As such, four screws are employed as shown. The screws are inserted horizontally to attach and secure the printer/copier 180 to the stand or base 170. As shown, two screws are inserted from the right side of the stand 170, and the other two screws are inserted from the left side. This positioning of the apparatus 152, 154, and the screws 166, 168 allows the screws to be visible and easily accessible when required.

The screws 166, 168 installed as such can be easily removed using a standard flat head or Philips head screw driver by the user or by a field service Engineer if necessary.

The moveable ratchet device 190, 200 is located within the rear portion of the screw receiving opening or hole 158, 164 for receiving and retaining the screw 166, 168. As shown in FIGS. 2 and 4, the moveable ratchet device 200 includes a deflectable flat spring front section 222 and a rear, screw thread or slot interfering section 224. The rear portion 224 includes the sharp edge 192, 202, and in one embodiment, the rear portion 224 is triangular as shown. As described above, the ratchet device 190, 200 has a first normal position for interfering and retaining a received screw, and a second position away from interference with a screw being received. It is also deflectable and has a first normal position (FIGS. 1 and 3) where it narrows and reduces a diameter D1 of the screw receiving opening or hole 158, 164 to a diameter which is less than the screw outside diameter D2. It also has a second deflected position (FIGS. 2 and 4) where it essentially maintains the diameter D1 of the screw receiving opening 158, 164.

The attaching and securing apparatus 152, 154 of the present invention is particularly suitable for attaching and securing the printer/copier or image output terminal (IOT) portion 180 of the machine to the base or stand 170. It is also equally suitable for attaching and securing an auxiliary paper feeding module 150 to another module 160. To attach and secure the various modules as such, the attaching and securing apparatus 152, 154 requires no tools, thus enabling it to be considered customer installable.

The attaching and securing apparatus 152, 154 also enables a field service engineer to easily unsecure and unattach it and so remove the module 150, 180 should it require service. The uniqueness of the present invention concept lies in the idea of using a low cost flat head screw 166, 168 with a flat or Phillips type recess (not shown) to attach and secure one module 150 to another 160 or to attach and secure the parent product 180 to a base or stand 170.

As can be seen, there has been provided an attaching and securing apparatus for removably attaching a first module of an office machine to a second module thereof. The attaching and securing apparatus includes (a) a first lug member on the first module having a first set of aligning features and a first screw receiving hole; (b) a second lug member on the second module having a second screw receiving hole for aligning with the first screw receiving hole, and a second set of aligning features for aligning with the first set of aligning features; (c) a ratchet device located inside at least one of the first and the second screw receiving holes for receiving and retaining a screw inserted therethrough, the ratchet device including at least one biased and deflectable spring member having a first normal position for reducing a diameter of the at least one screw receiving hole, and a second deflected position for engaging threads of an inserted screw and for effectively retaining the inserted screw within the first and the second screw receiving holes; and (d) a removable screw for manually and easily inserting through the first and the second screw receiving holes, the screw having a root diameter, surface features, and an outside diameter essentially equal to the diameter of each of the first and the second screw receiving holes, thereby enabling easy manual securing and removable attachment of the first module of the office machine to the second module thereof.

While the embodiment of the present invention disclosed herein is preferred, it will be appreciated from this teaching that various alternative, modifications, variations or improvements therein may be made by those skilled in the art, which are intended to be encompassed by the following claims:

What is claimed is:

1. An attaching and securing apparatus for removably attaching a first module of an office machine to a second module thereof, the attaching and securing apparatus comprising:
   (a) a first lug member on the first module, said first lug member having a first set of aligning features and a first screw receiving hole formed therethrough;
   (b) a second lug member on the second module, said second lug member having a second screw receiving hole formed therethrough for aligning with said first screw receiving hole, and a second set of aligning features for aligning with said first set of aligning features, thereby locating and aligning the first module to the second module;
   (c) a ratchet device located inside at least one of said first and said second screw receiving holes for receiving and retaining a screw inserted therethrough, said ratchet device including at least one biased and deflectable spring member having a first normal position for reducing a diameter of said at least one screw receiving hole, and a second deflected position for engaging surface features of an inserted screw and for effectively retaining the inserted screw within said first and said second screw receiving holes; and
   (d) a removable screw for manually and easily inserting through said first and said second screw receiving holes, said screw having a root diameter, surface features, and an outside diameter essentially equal to the diameter of each of said first and said second screw receiving holes, thereby enabling easy manual securing and removable attachment of the first module of the office machine to the second module thereof.

2. The attaching and securing apparatus of claim 1, wherein said at least one biased and deflectable spring member has a sharp distal edge for effectively engaging said surface features on a surface of an inserted screw.

3. The attaching and securing apparatus of claim 1, wherein said surface features of said removable screw comprise screw threads rising above said root diameter.

4. The attaching and securing apparatus of claim 1, wherein said root diameter comprises said outside diameter.

5. The attaching and securing apparatus of claim 4, wherein said surface features of said removable screw comprise slots cut into said a surface defining said outside diameter.

6. The attaching and securing apparatus of claim 1, wherein said screw receiving holes each have a countersunk portion.

7. The attaching and securing apparatus of claim 1, wherein said each of said removable screws has a flat head.

8. An attaching and securing apparatus for removably attaching an office machine module including a frame to a stand, the attaching and securing apparatus comprising:
   a. plural screw holes formed through the frame of the office machine module;
   b. plural locator members premounted on the stand, each of said plural locator members having a screw receiving opening formed therethrough, and a ratchet device located inside said screw receiving opening for receiving and retaining a screw, said ratchet device being deflectable and having a first normal position reducing a diameter of said screw receiving opening, and a second deflected position essentially maintaining said diameter of said screw receiving opening; and
   c. a screw for inserting through said screw hole and said screw receiving opening, said screw having a thread and an outside diameter essentially equal to a diameter of each screw hole of said plural screw holes and of each screw receiving opening, thereby enabling easy manual securing and removable attachment of the first module of the office machine to the second module thereof.

9. The attaching and securing apparatus of claim 8, wherein said at least one biased and deflectable spring member has a sharp distal edge for effectively engaging said surface features on a surface of an inserted screw.

10. The attaching and securing apparatus of claim 8, wherein said surface features of said removable screw comprise screw threads rising above said root diameter.

11. An attaching and securing apparatus for attaching a first office machine module having a frame to a second office machine module, the attaching and securing apparatus comprising:
   a. plural screw holes formed through the frames of the first office module;
   b. plural module-to-module locating members mounted on the second office module for locating the first machine module relative to the first machine module, each of said module-to-module locating members having a front side, a rear side, a screw receiving opening formed therethrough having a front position and a rear position;
   c. a moveable ratchet device located within said rear position of said screw receiving opening for receiving and retaining a screw, said ratchet device having a first normal position for interfering and retaining a received screw, and a second position away from interference with a screw being received; and
   d. threaded screws for attaching and securing the frame of the first office module to said plural module-to-module locating members, each said threaded screw having a length at least equal to said given depth of said screw receiving opening, and a thread for moving said movable ratchet device from said first position to said second position, and for latching against said moveable ratchet device in said first position.

12. The attaching and securing apparatus of claim 11, wherein said moveable ratchet device includes a deflectable flat spring front section and a screw thread interfering triangular rear section.

13. The attaching and securing apparatus of claim 11, wherein said threaded screw includes a slotted head for screw removal.

14. The attaching and securing apparatus of claim 11, wherein said plural module-to-module locating members comprise at least three, including one mounted at each of four corners of a top the second office machine module.

15. An electrostatographic reproduction machine comprising:
   a. a first module;
   b. at least a second module for attaching and securing to said first module; and
   c. an attaching and securing apparatus for removably attaching and securing said first module to said second module, said attaching and securing apparatus comprising:

(i) a first lug member on the first module, said first lug member having a first set of aligning features and a first screw receiving hole formed therethrough;

(ii) a second lug member on the second module, said second lug member having a second screw receiving hole formed therethrough for aligning with said first screw receiving hole, and a second set of aligning features for aligning with said first set of aligning features, thereby locating and aligning the first module to the second module; and (iii) a ratchet device located inside at least one of said first and said second screw receiving holes for receiving and retaining a screw inserted therethrough, said ratchet device including at least one biased and deflectable spring member having a first normal position for reducing a diameter of said at least one screw receiving hole, and a second deflected position for engaging threads of an inserted screw, and effectively retaining the inserted screw within said first and said second screw receiving holes.

16. The electrostatographic reproduction machine of claim 15, wherein said first module is a machine stand.

17. The electrostatographic reproduction machine of claim 15, wherein said second module is an auxiliary paper supply tray.

18. The electrostatographic reproduction machine of claim 15, wherein said moveable ratchet device includes a deflectable flat spring front section and a screw thread interfering triangular rear section.

19. The electrostatographic reproduction machine of claim 15, wherein said at least one biased and deflectable spring member has a sharp distal edge for effectively engaging said surface features on a surface of an inserted screw.

20. The electrostatographic reproduction machine of claim 15, wherein said second module comprises an image output terminal of the machine.

* * * * *